(12) United States Patent
Griffiths

(10) Patent No.: US 6,955,962 B2
(45) Date of Patent: Oct. 18, 2005

(54) DEEP TRENCH CAPACITOR HAVING INCREASED SURFACE AREA

(75) Inventor: David Griffiths, Mechanicsville, VA (US)

(73) Assignee: Infineon Technologies Richmond, LP, Sandston, VA (US)

( * ) Notice: Subject to any disclaimer, the term of this patent is extended or adjusted under 35 U.S.C. 154(b) by 116 days.

(21) Appl. No.: 10/697,649

(22) Filed: Oct. 31, 2003

(65) Prior Publication Data
US 2005/0093048 A1    May 5, 2005

(51) Int. Cl.[7] .......................................... H01L 21/8242

(52) U.S. Cl. ...................... 438/243; 438/244; 438/245; 438/387; 438/388; 438/627; 438/643; 438/653

(58) Field of Search .............................. 438/244, 245, 438/387, 388, 627, 643, 653

(56) References Cited
U.S. PATENT DOCUMENTS
6,677,197 B2 * 1/2004 Kudelka et al. ............ 438/245

* cited by examiner

Primary Examiner—David Nelms
Assistant Examiner—Mai-Huong Tran
(74) Attorney, Agent, or Firm—Staas & Halsey LLP

(57) ABSTRACT

A method of fabricating a trench capacitor of a memory cell, includes providing a semiconductor substrate with a surface covered by a pad layer, forming a trench in the substrate, forming a first layer on the pad layer and on the surface of the trench, removing a portion of the first layer to form a residual first insulating layer, forming a first conductive layer on the residual first layer, removing a portion of the first conductive layer, removing a portion of the residual first layer, driving out charged elements from the first layer into the semiconductor substrate, to form a first doped substrate region, removing the first layer, forming a node nitride on the trench, forming a second conductive layer on the pad layer and on the trench, removing a portion of the second conductive layer to form a second doped substrate region in the trench.

20 Claims, 26 Drawing Sheets

DEEP TRENCH CAPACITOR HAVING INCREASED SURFACE AREA

BACKGROUND OF THE INVENTION

The present invention relates to an integrated circuit (IC) and a method of fabricating integrated circuits and more particularly to deep trench capacitors having an increased surface area.

A memory cell, such as a DRAM, in an IC comprises a transistor and an associated capacitor. The capacitor, which is typically formed in a portion of a trench, has a pair of conductive plates, i.e., electrodes, which are separated from each other by a node dielectric material. Information or data is stored in the memory cell in the form of charge accumulated on the capacitor. As the density of the ICs with memory cells increases, the area for the capacitor becomes smaller and the amount of charge the capacitor is able to accumulate is reduced. Thus, with less charge to detect, reading the information or data from the memory cell becomes much more difficult.

With a limited fixed space or volume for the capacitor of a memory cell in a highly integrated circuit, there are three known techniques for increasing the amount of charge within a fixed space or area. These three known techniques include: (1) decreasing the thickness of the dielectric material, i.e., node dielectric, that is located between the capacitor plates; (2) changing the dielectric material to one with a dielectric constant higher than $SiO_2$ or $Si_3N_4$; or (3) increasing the surface area of the space to be used for the capacitor.

Of the above-mentioned techniques, solution (3) is the most viable because the other two solutions have drawbacks associated therewith. For example, solution (1), which thins the capacitor dielectric, also increases leakage currents that may affect the memory retention performance of the capacitor and the reliability of the memory cell. Solution (2), which purports to change the dielectric material to a higher-dielectric material, will only cause a slight improvement in charge storage because the dielectric constant of suitable alternative dielectrics in only slightly higher than the dielectric material currently being used. Moreover, the substitution of alternative dielectrics may be more complicated, more expensive and provide fabrication problems that are heretofore unknown. Accordingly, solution (3), i.e., increasing the surface area of the space to be used for the capacitor, provides the most promise for substantially improving the amount of charge stored without causing any of the problems mentioned for solutions (1) and (2) above.

One solution to increase the surface area of the capacitor is to replace common stack capacitor technology with trench capacitors. In common stack capacitor technology, the capacitor is built on a surface created on a semiconductor substrate. On the other hand, in trench capacitor technology, the capacitor is formed within a trench that is formed in a semiconductor substrate itself. An increase in depth of the trench increases the surface area of the capacitor. However, present fabrication methods and tools limit the depth of the trench. This problem is further compounded by the forever increasing density of ICs achieved by dimensional shrinkage. To offset the loss of surface area due to a reduction in width, the depth of the trench must be further increased to the point where the necessary depth is not achievable or becomes prohibitively expensive.

FIGS. 1A to 1E are sectional diagrams illustrating a method of fabricating a trench capacitor of a DRAM cell according to the prior art.

In FIG. 1A, a semiconductor substrate 100 is provided. A pad oxide layer 102 with thickness of about 200 angstroms is formed on the substrate 100 by oxidation. Subsequently, a pad nitride layer 104 with thickness of about 1600 angstroms is formed on the pad oxide 102 by low-pressure chemical vapor deposition (LPCVD). The pad oxide 102 and the paid nitride 104 constitute the pad layer 107. A first masking layer 108 such as boron-silicate glass (BSG) with thickness of 5,000 angstroms is formed on the pad layer 107 by CVD.

In FIG. 1B, the first masking layer 108 is defined as a mask to dry etch the pad layer 107 and the substrate 100 to form a deep trench 112 with depth of about 6 micron meters. Subsequently, the pad layer 107 is used as a stop layer to remove the first masking layer 108 by isotropic etching.

In FIG. 1C, a doped insulating layer 120 such as an arsenic-silicate glass (ASG) with thickness of 50 to 400 angstroms conformally covers the pad layer 107 and the sidewall and the bottom of the deep trench 112 by in-situ arsenic doped LPVCD. Subsequently, a first photoresist (PR) layer (not shown) is filled into the deep trench 112. The upper portion of the first photoresist layer is removed by PR stripping, and the remaining first photoresist layer is represented as the residual first photoresist layer 125'.

In FIG. 1D, the doped insulating layer 120 on the pad layer 107 and above the residual first photoresist layer 125' in the deep trench 112 is removed by isotropic etching and the remaining doped insulating layer 120 is represented as a residual doped insulating layer 120'. Thereafter, the residual first photoresist layer 125' is removed. An insulating layer 128 such as a tetraethyl orthosilicate (TEOS) oxide with thickness of 50 to 500 anstroms conformally covers the pad layer 107, sidewall of the deep trench 112 and surface of the residual doped insulating layer 120' by LPCVD.

In FIG. 1E, after a drive-in process is performed, the arsenic ions in the residual doped insulating 120' are driven into the substrate 100 to form junctions with depth of about 800 angstroms as a bottom electrode 130. Afterwards, the insulating layer 128 and the residual doped insulating layer 120' are removed. A dielectric layer 140 is formed on the surface of the bottom electrode 130, and a conductive layer (not shown) such as a polycrystalline silicon in-situ doped with arsenic ions or phosphorus ions is then fully filled in the deep trench 112. A portion of the conductive layer in the deep trench 112 is removed, and a portion of the conductive layer surrounded by the dielectric layer 40 remains to form a top electrode 150. Accordingly, the manufacture of the trench capacitor of a memory cell is completed.

However, since the depth of the trench is limited by present fabrication methods and tools, there is a need to develop a new and improved method and capacitor which increases the surface area of the capacitor in deep trench memory cell without causing the substantial drawbacks mentioned in solutions (1) and (2) above.

SUMMARY OF THE INVENTION

One aspect of the present invention is to provide a method of fabricating a deep trench memory cell such as a deep trench dynamic random access memory (DT DRAM) cell in which the surface area of the capacitor has been increased.

A further aspect is to provide a method of fabricating a deep trench memory cell in which the capacitor surface area is increased without causing any substantial current leakage through the cell.

Accordingly, one aspect is directed to an integration scheme for high capacity deep trench capacitor that substantially obviates one or more of the problems due to limitations and disadvantages of the related art.

Another aspect is to provide an integration scheme for a high capacity deep trench capacitor.

Another aspect is to provide a "finger" like structure, or protrusion on a bottom surface of a deep trench, thus extending the total surface area for the trench.

Another aspect is to provide a deep trench capacitor having increased capacitance.

Another aspect is to increase the total surface area for the deep trench.

Additional aspects and/or advantages will be set forth in part in the description which follows and, in part, will be obvious from the description, or may be learned by practice of the invention.

In an aspect of the invention, the deep trench capacitor having increased surface area includes providing a semiconductor substrate with a surface covered by a pad layer; forming a trench in the substrate; forming a first insulating layer on an upper surface of the semiconductor substrate and within the trench of the semiconductor substrate; removing a portion of the first insulating layer formed on the upper surface of the semiconductor substrate and removing a portion of the first insulating layer formed on a bottom surface of the trench to form a residual first insulating layer; forming a first conductive layer on the residual first insulating layer; removing a portion of the first conductive layer; removing the residual first insulating layer to form a conductive protrusion within the trench; depositing arsenic glass in the trench; driving out arsenic from the arsenic glass into the semiconductor substrate, to form a first doped substrate region; forming a node nitride on the conductive protrusion and on the trench; forming a second conductive layer on the pad layer and on the trench, and removing a portion of the second conductive layer to form a second doped substrate region in the trench.

In another aspect, a method of fabricating a trench capacitor of a DRAM, includes forming a pad layer on a semiconductor substrate; forming a trench on the semiconductor substrate and on the pad layer; forming an oxide layer on the pad layer and on the deep trench; removing the oxide layer from the pad layer and a bottom surface of the trench; forming a first conductive layer on the pad layer and on the deep trench; removing the first conductive layer from the pad layer and from a portion of the deep trench; removing the oxide layer from the deep trench to form a conductive structure protruding from the bottom of the trench; depositing arsenic glass in the trench; driving out arsenic from the arsenic glass into the semiconductor substrate, to form a first doped substrate region; forming a node nitride on the trench and on the conductive structure protruding from the bottom of the trench; forming a second conductive layer on the pad layer and on the trench; removing a portion of the second conductive layer to form a second doped substrate region in the trench.

In another aspect, an integrated circuit includes a semiconductor substrate having a trench; a protrusion extending from a bottom center of said trench forming a first conductive plate; a dielectric layer formed on the first conductive plate, and a second conductive plate formed on the dielectric layer.

In another aspect, a method of fabricating a capacitor in a semiconductor device having an upper surface and a trench, includes forming a first insulating layer on the upper surface and within the trench of the semiconductor device; removing the first insulating layer formed on the upper surface of the semiconductor device to thereby form a residual first insulating layer within the trench and expose the upper surface of the semiconductor device; forming a first conductive layer on the residual first insulating layer; removing a portion of the first conductive layer; removing the residual first insulating layer to form a conductive structure within the trench; forming a dielectric layer on the trench and the conductive structure, and forming a second conductive layer on the dielectric layer.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE PREFERRED EMBODIMENTS

Figure 1A:
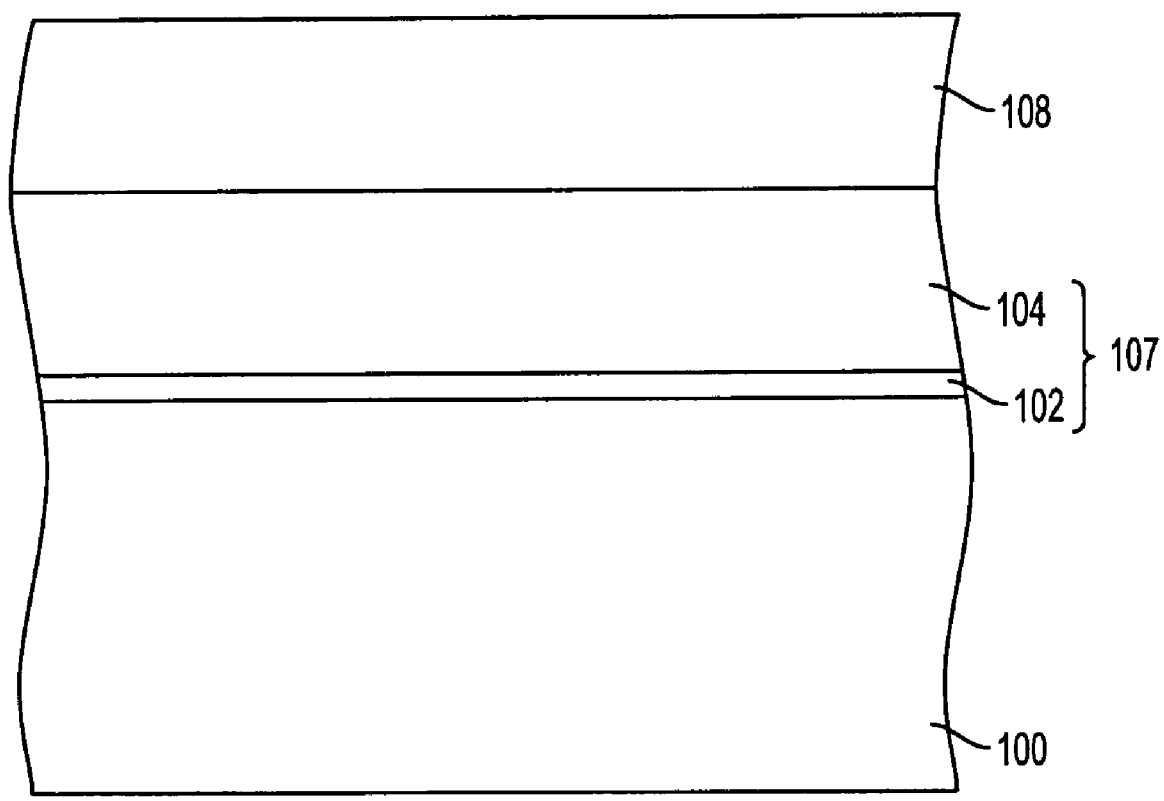
FIGS. 1A to 1E are sectional diagrams showing a method of fabricating a trench capacitor of a DRAM cell according to the prior art.
Figure 1B:
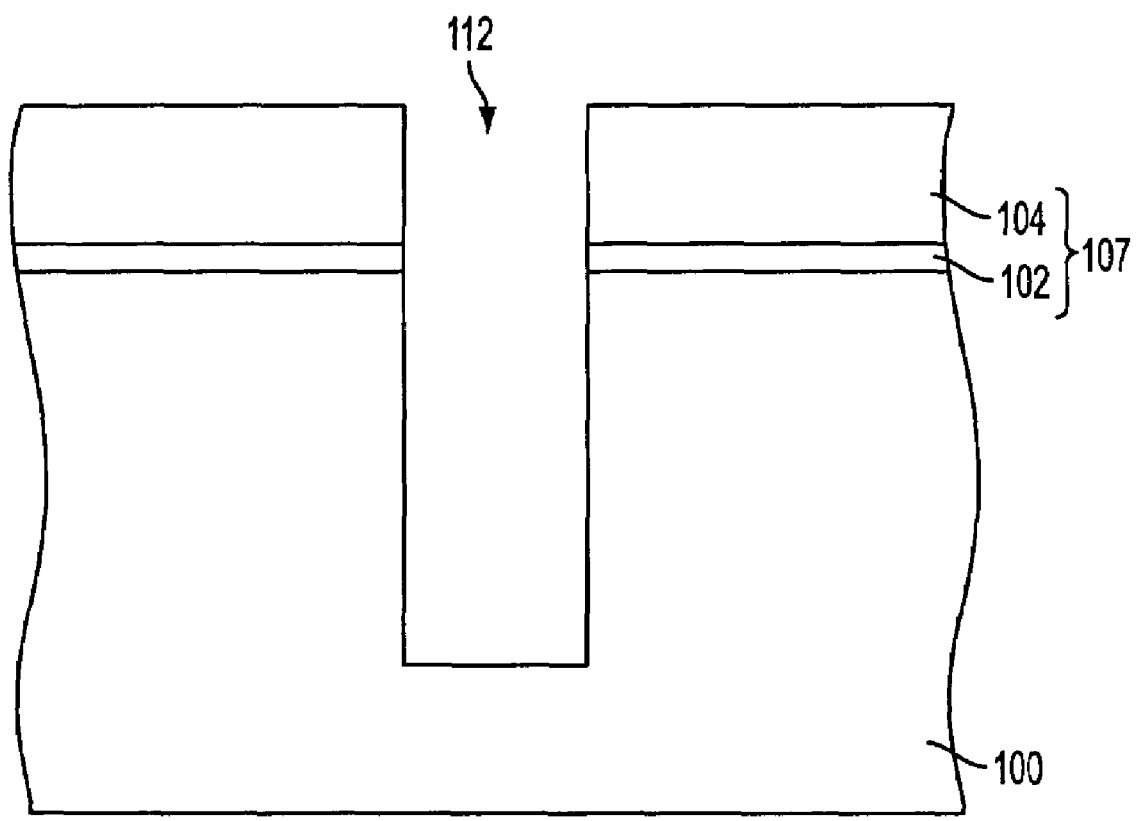
Figure 1C:
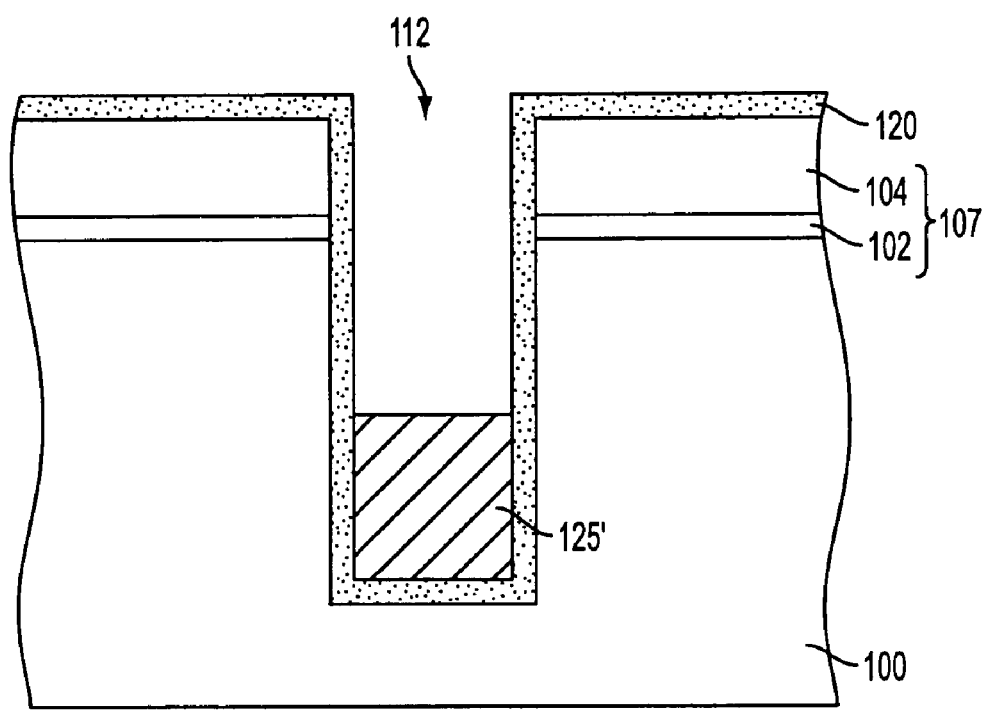
Figure 1D:
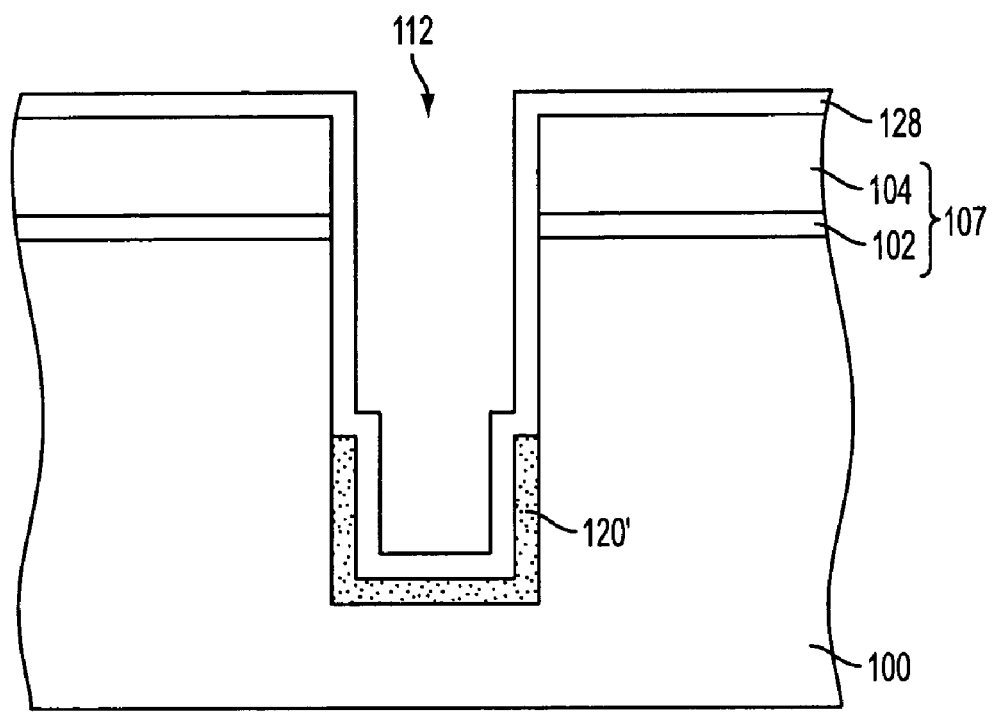
Figure 1E:
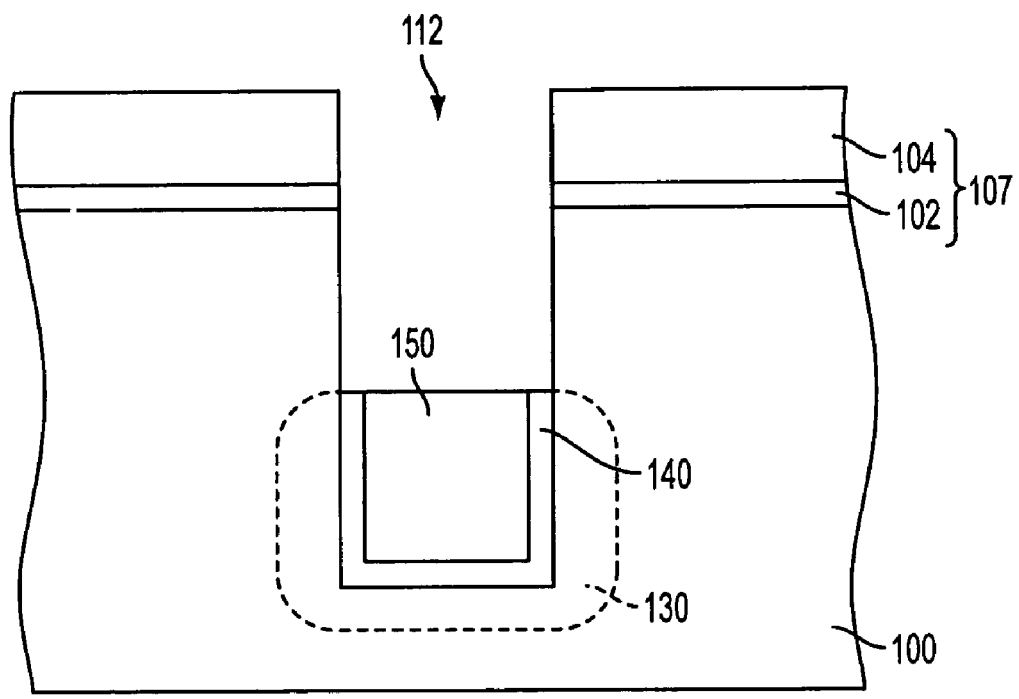

Reference will now be made in detail to the embodiments of the present invention, examples of which are illustrated in the accompanying drawings, wherein like reference numerals refer to the like elements throughout. The embodiments are described below to explain the present invention by referring to the figures.

FIGS. 2A to 2K are sectional diagrams showing a method of fabricating a deep trench capacitor of a DRAM cell according to one potential embodiment of the present invention.

Figure 2A:
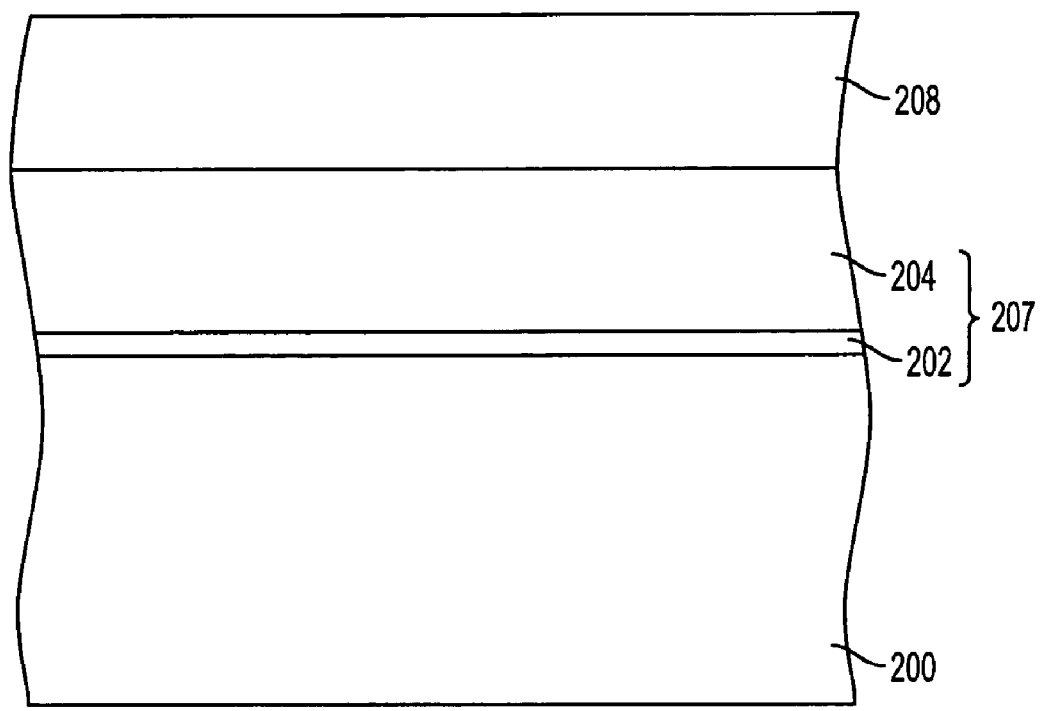
FIGS. 2A to 2K are sectional diagrams showing a method of fabricating a deep trench capacitor of a DRAM cell according to one potential embodiment of the present invention.

In FIG. 2A, a semiconductor substrate 200 is provided. The semiconductor substrate 200 is composed of a known semiconductor material such as silicon or germanium. The substrate 200 can be epitaxial silicon or silicon on insulator (SOI). For simplicity, a P-type semiconductor silicon substrate 200 is taken as an example. A pad oxide layer 202 with thickness of about 50 to 600 angstroms is formed on the substrate 200 by oxidation. A pad nitride layer 204 with thickness of about 1600 to 3000 angstroms is then formed on the pad oxide 202 by chemical vapor deposition (CVD). The pad oxide 202 and the pad nitride 204 constitute the pad layer 207. A first masking layer 208 such as a boron-silicate glass (BSG) having a thickness of about 5,000 to 20,000 angstroms is formed on the pad layer 207 by CVD. Thereafter, thermal reflow process, etch back process or chemical mechanical polishing (CMP) planarizes the masking layer 208.

Figure 2B:
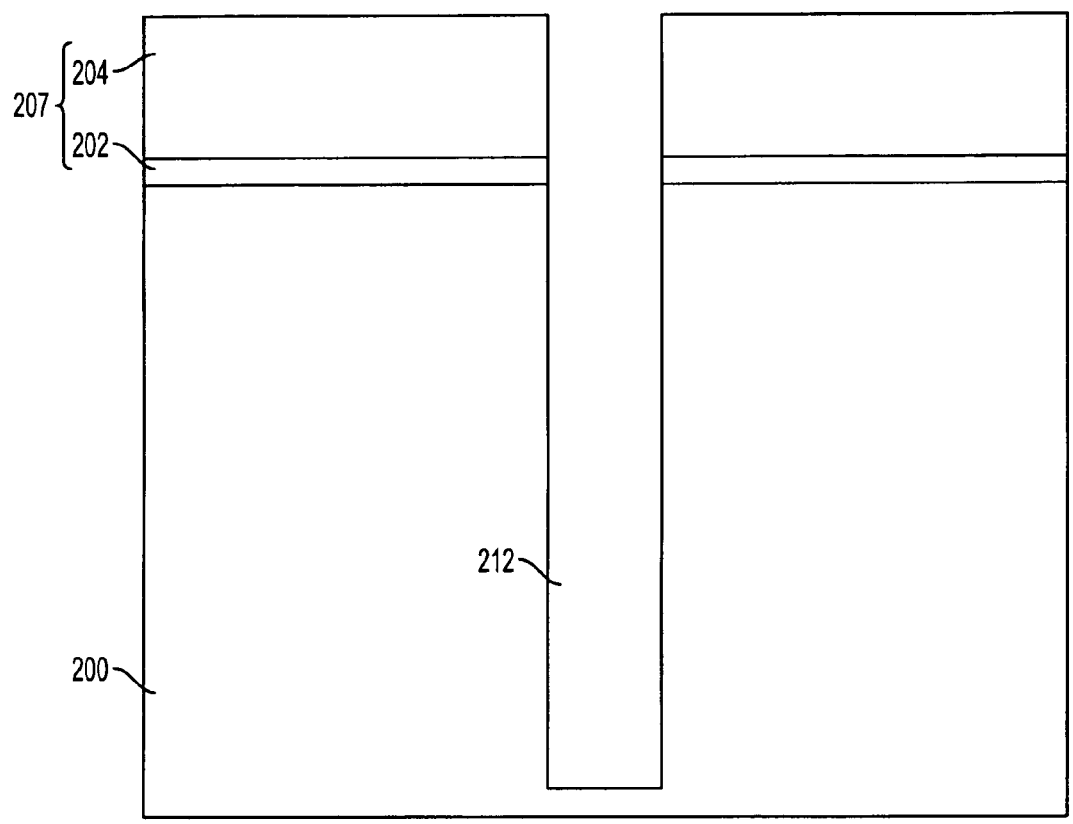

In FIG. 2B, the masking layer 208 is defined by photolithography and etching. Subsequently, the pad layer 207 and the substrate 200 are defined to form a deep trench 212 with a depth of about 150 to 200 nanometers into the substrate 200 by anisotropic etching using the masking layer 208 as a mask. However, the depth and width of the trench may shrink with each generation of technology. Therefore, the method and device of the present embodiment are not limited to the dimensions recited herein, but the dimensions may be modified according to technological advances incorporating shrinking technology. After the formation of the deep trench 212, the masking layer 208 is removed by anisotropic etching using the pad layer 207 as an etching stop layer.

Figure 2C:
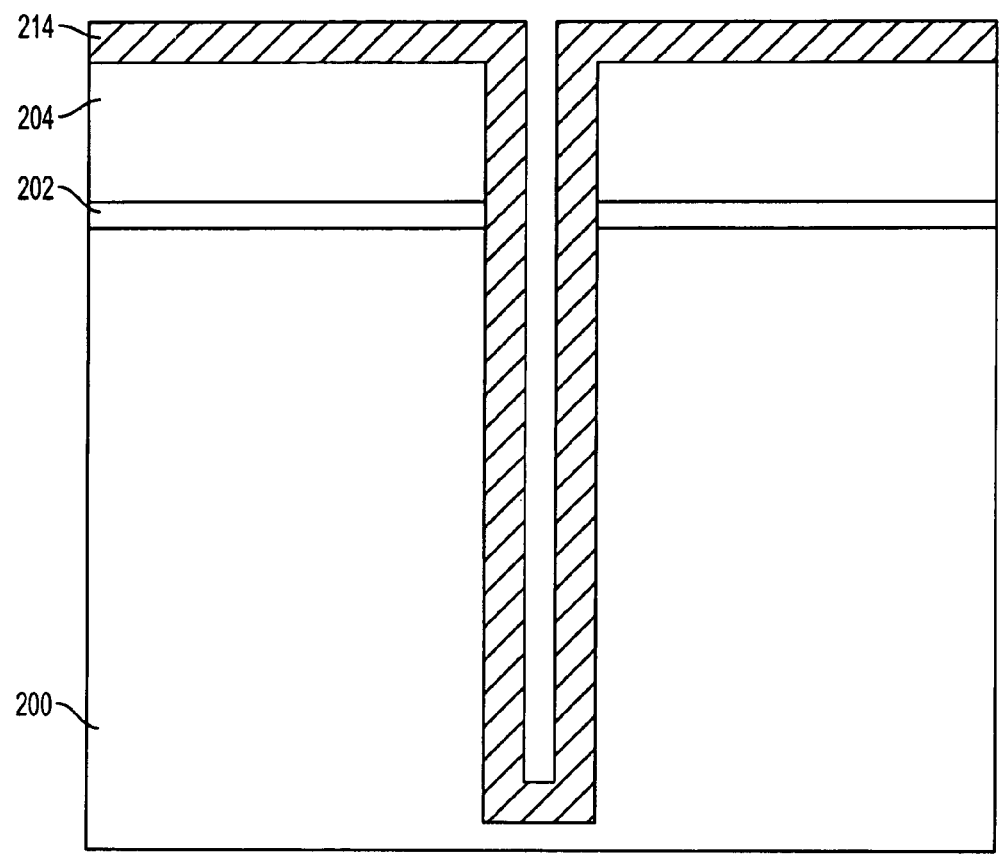

In FIG. 2C, a first insulating layer, such as an oxide layer 214, is formed on the pad layer 207 and on the sidewalls and bottom of the deep trench 212. The first insulating layer 214 may be of a material that can be selectively etched with respect to Silicon, for example, the material could be an oxide, or even a doped insulating layer like ASG. Using ASG would simplify the process and allow Arsenic out diffusion to be performed after the recess of the poly finger or protrusion to be explained later. The first insulating layer 214 has a thickness of about 10 to 200 angstroms and is conformably formed on the pad layer 207 and the surface of the deep trench 212 by low-pressure CVD (LPCVD).

Figure 2D:
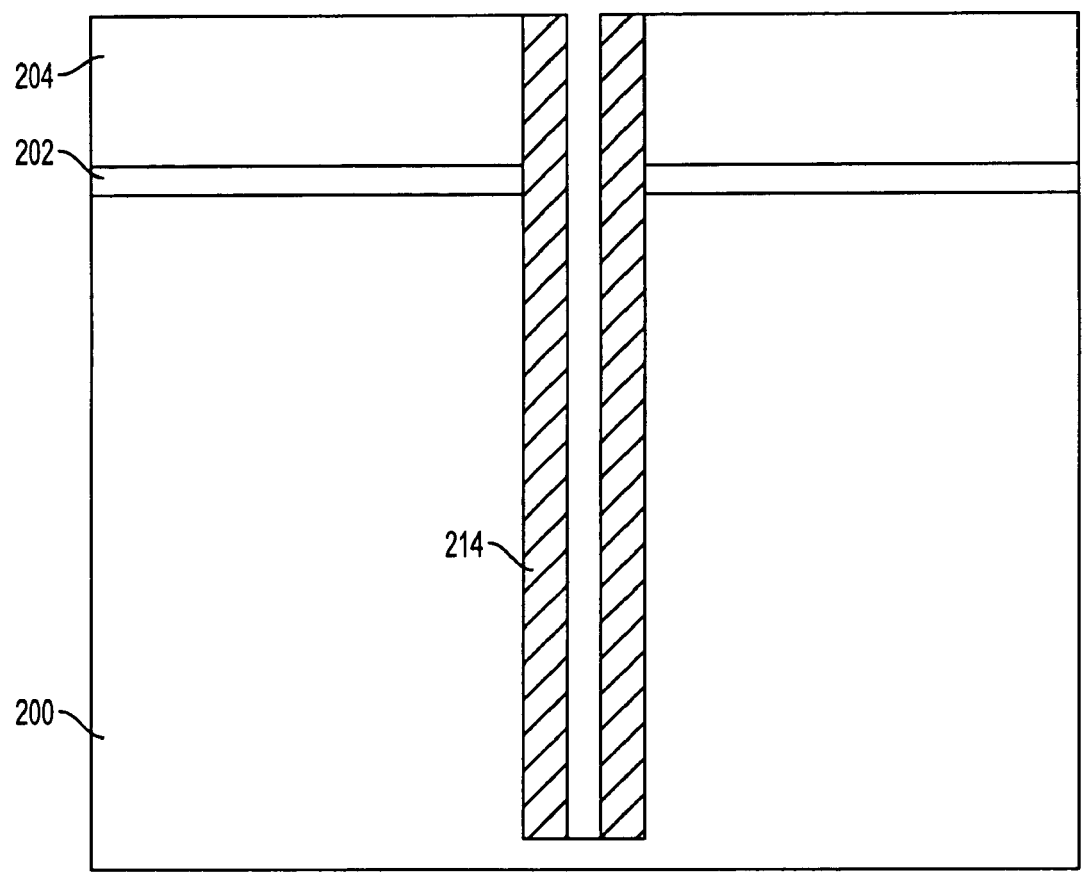

In FIG. 2D, the oxide layer 214 is removed from the top of the pad layer 207 and from the bottom of the deep trench 212 by a spacer type etch process, similar to a collar oxide process. No lithography is required to remove the oxide layer 214. An anisotropic high powered etch with $C_4F_8$ and argon clears the bottom of the trench and the material off the top of the Pad SiN and leaves remainig oxide (or ASG) on the sidewalls of the trench.

Figure 2E:
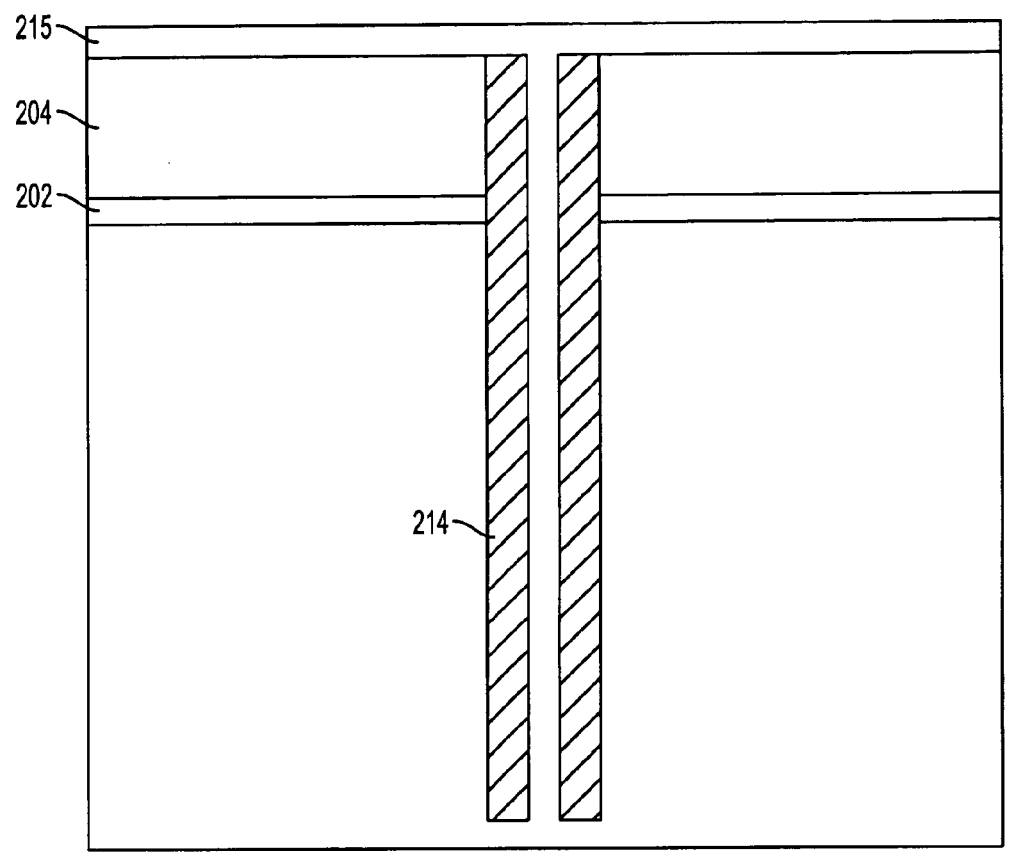

In FIG. 2E, a polycrystalline silicon layer 215 is formed by LPCVD silane based deposition on pad layer 207 and on the deep trench 212. The polycrystalline silicon layer 215 has a thickness of approximately 300 nanometers.

Figure 2F:
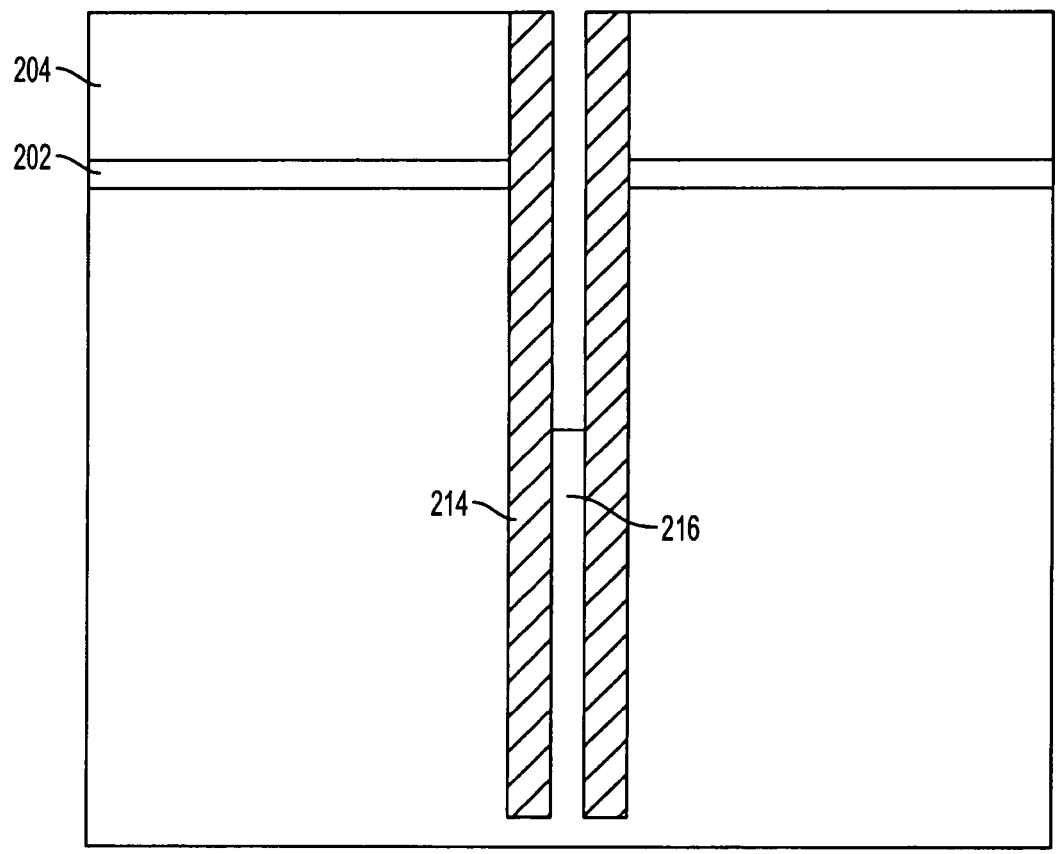

In FIG. 2F, the polycrystalline silicon layer 215 is removed from the top of pad layer 207 and recessed a predetermined distance into the deep trench 212. A recess etch (reactive ion etch) is used to recess the polycrystalline silicon layer 215 a predetermined distance forming structure 216. This process is a timed etched process.

Figure 2G:
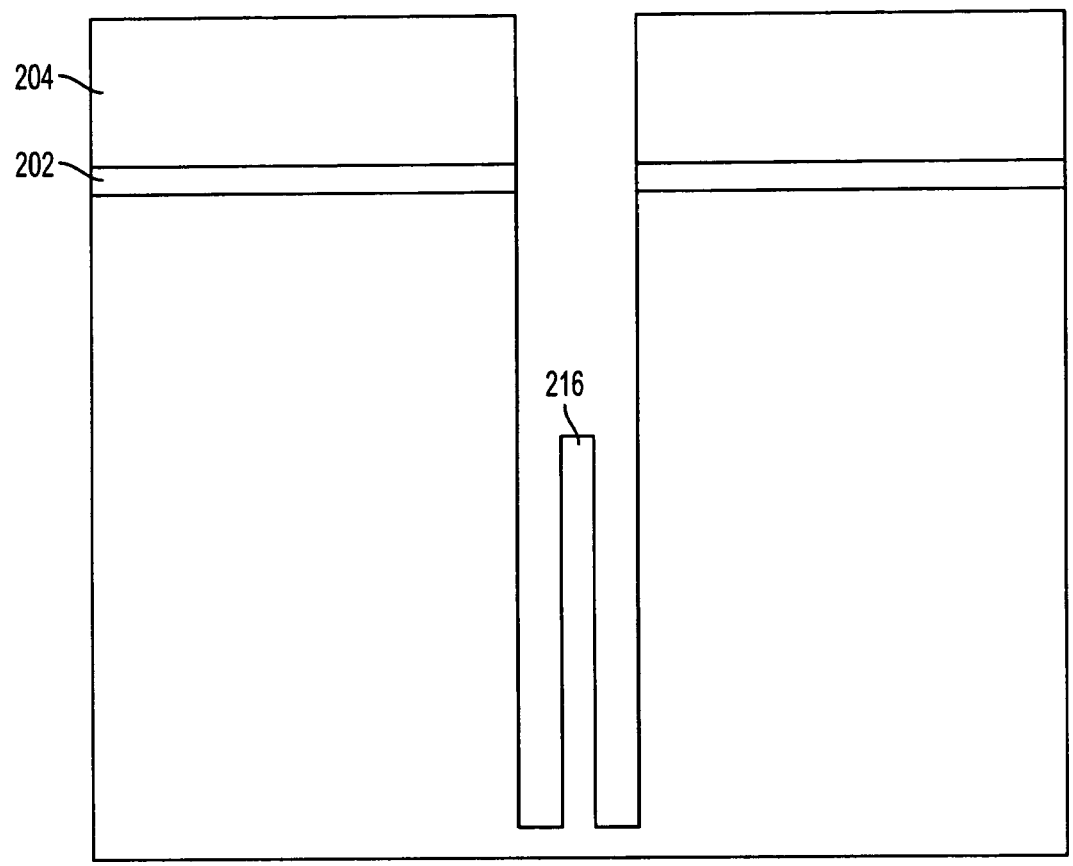

In FIG. 2G, the oxide layer 214 is removed from the sidewall of the deep trench 212, using for example, a wet etchant, forming a protrusion or a finger like structure 216 at the bottom of the trench. The finger may have a height of about 3 micron meters. However, it should be noted that the height and width of the finger like structure is not limited to the disclosed dimensions but is rather and exemplary measure. Accordingly, the width and height of the entire capacitor may greatly vary depending on the advancement of technologies. That is, by decreasing the size of the semiconductor structure the width and height of the protrusion may also decrease. Conversely, by increasing the size of the semiconductor structure, the width and height of the protrusion may also increase.

Figure 2H:
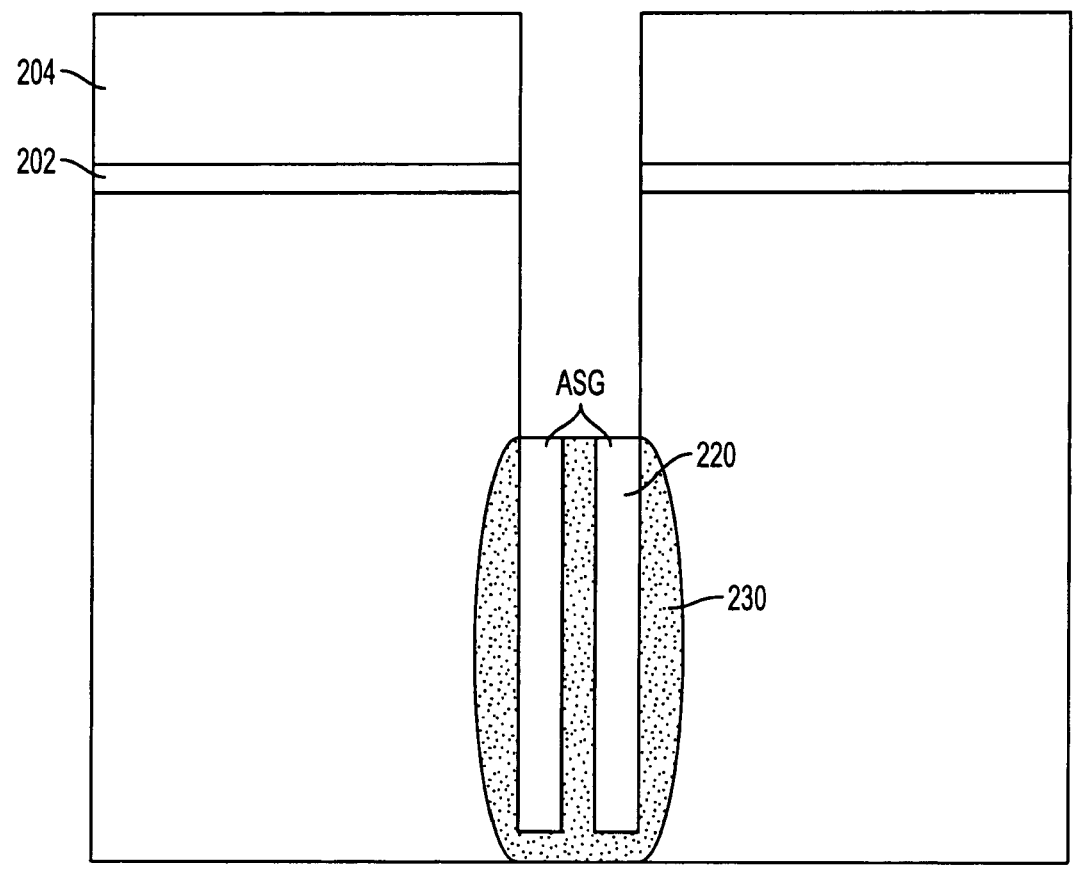

In FIG. 2H, a doped insulating layer 220 such as an arsenic-silicate glass (ASG) is deposited on the deep trench 212 by arsenic doped LPCVD. The doped insulating layer 220 is recessed to the top of the finger like structure 216 using a wet etch. The arsenic ions are driven into the adjacent areas of the substrate 200 to form a doped area in the substrate with depth of about 800 angstroms as a bottom electrode 230.

Figure 2I:
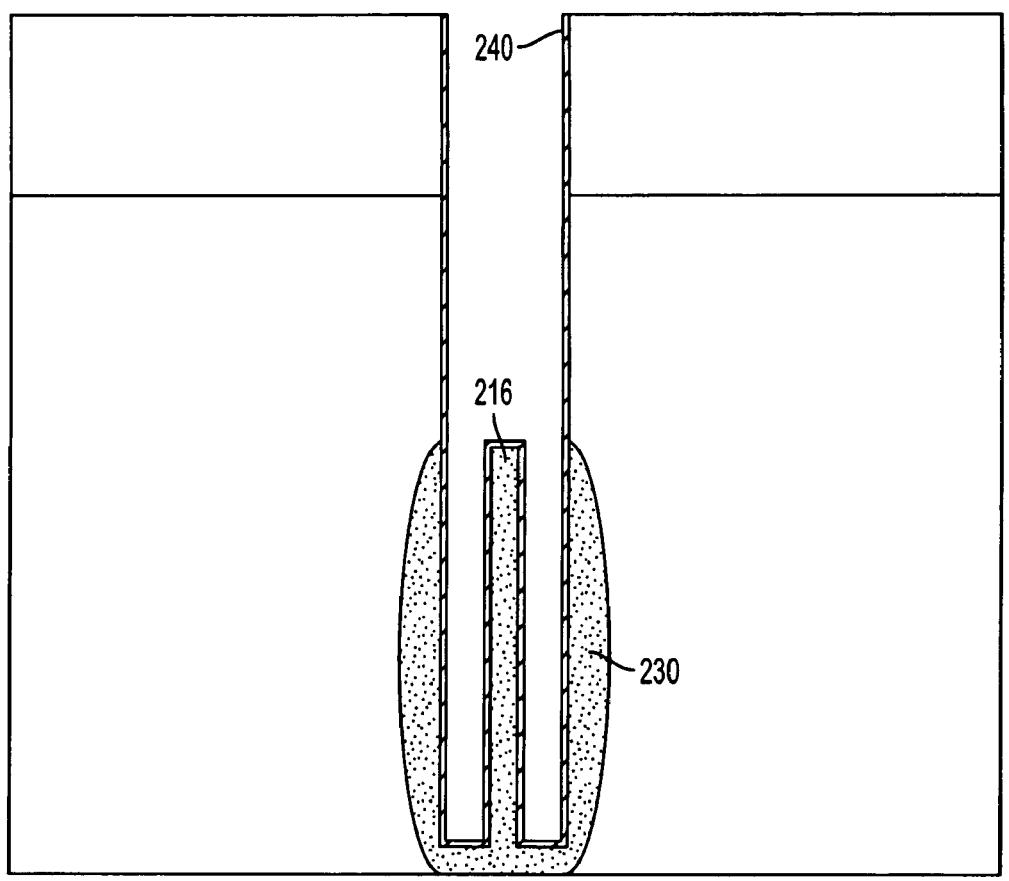

In FIG. 2I, the remainder of the doped insulating layer 220 is removed with an etchant, for example, an HF-based etchant, and a dielectric layer 240, such as a node nitride, is formed on the sidewalls of the deep trench 212 and on the surface of the bottom electrode 230.

Figure 2J:
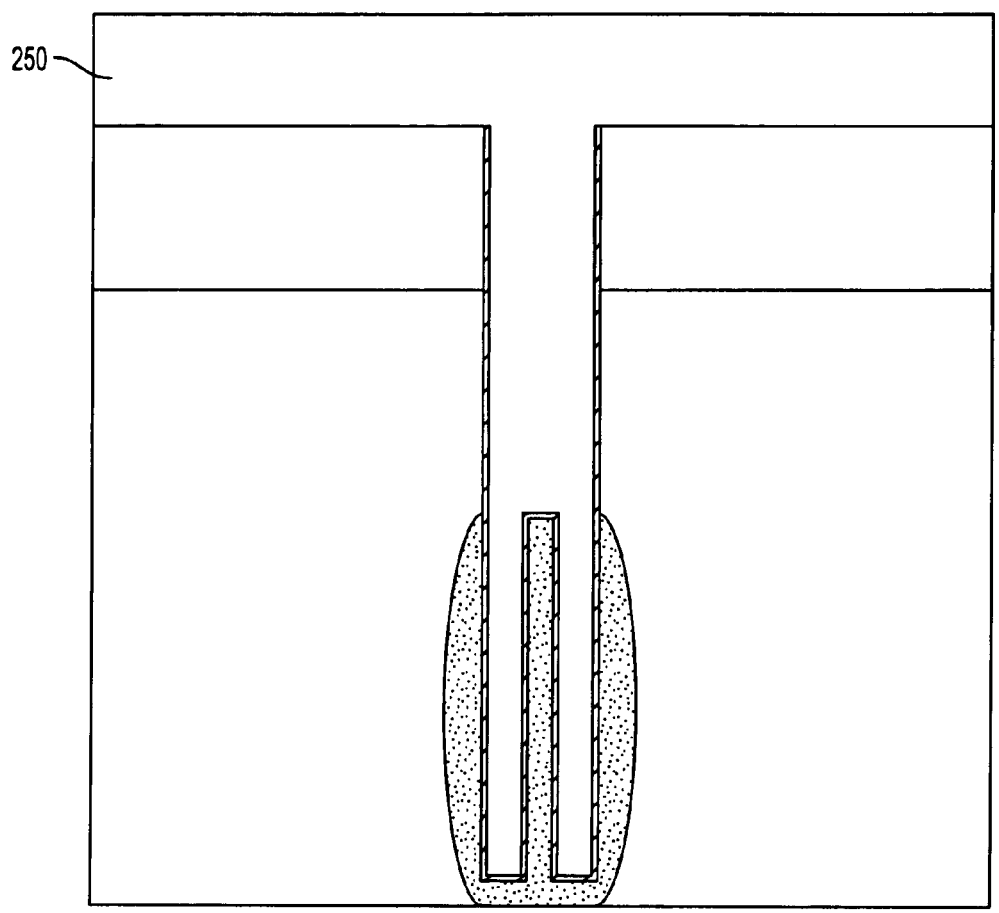

In FIG. 2J, a conductive layer 250 such as polycrystalline silicon doped with arsenic ions or phosphorus ions is formed on the deep trench 212 and on the pad layer 207 by LPCVD silane based deposition, for example, and has a thickness of about 300 nanometers.

Figure 2K:
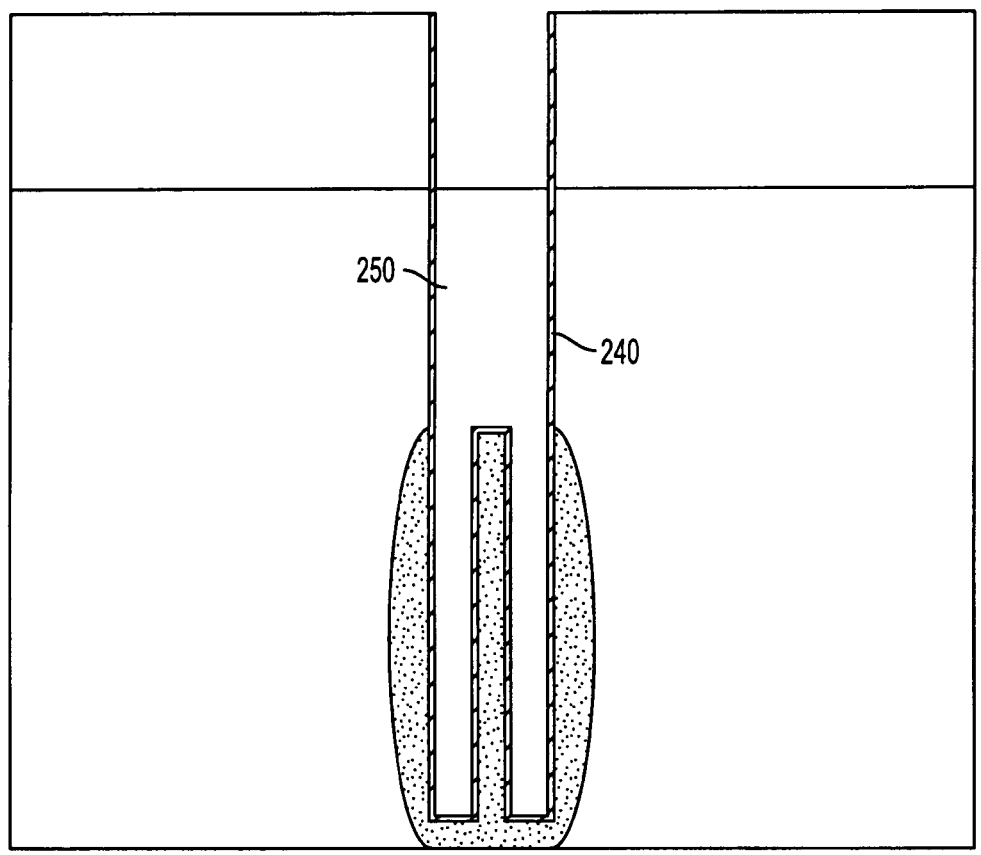

In FIG. 2K, a portion of the conductive layer 250 formed on the deep trench 212 is removed by recess etching (having parameters such as pressure He BSC ⅔ Torr; pressure 10 mTorr; bias power 90 W; RF-Power 600 W; flow Cl2 60 sccm; flow SF6 30 sccm; time 17 sec) or anisotropic reactive ion etch, and the remaining portion of the conductive layer 250 surrounded by the dielectric layer 240 forms a top electrode 250. Accordingly, the manufacture of the trench capacitor of a memory cell is completed.

FIGS. 3A to 3J are sectional diagrams showing a method of fabricating a deep trench capacitor of a DRAM cell according to another potential embodiment of the present invention.

FIGS. 3A–3E correspond respectively with FIGS. 2A to 2E with the exception that a doped insulator is used as insulator layer 214. In FIGS. 2A to 2E, an oxide could be used as the insulator 214. In FIGS. 3A to 3E, a doped insulator, more particularly a doped glass, and still more particularly arsenic glass silicate (ASG) is insulator layer 214.

Figure 3A:
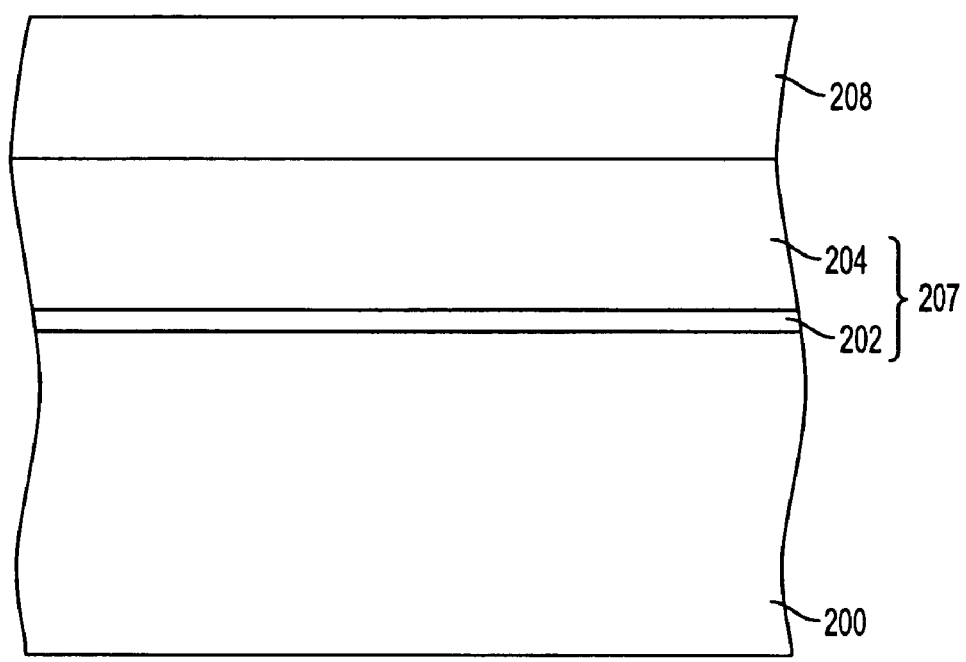
FIGS. 3A to 3J are sectional diagrams showing a method of fabricating a deep trench capacitor of a DRAM cell according to another potential embodiment of the present invention.
Figure 3B:
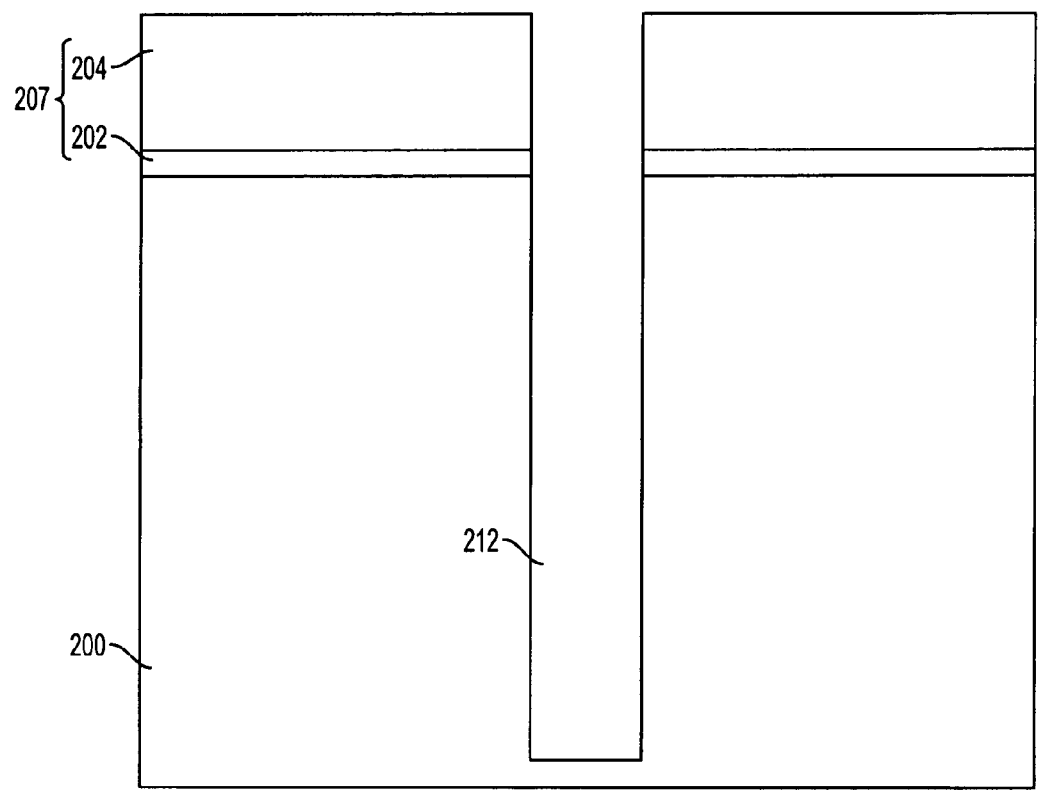
Figure 3C:
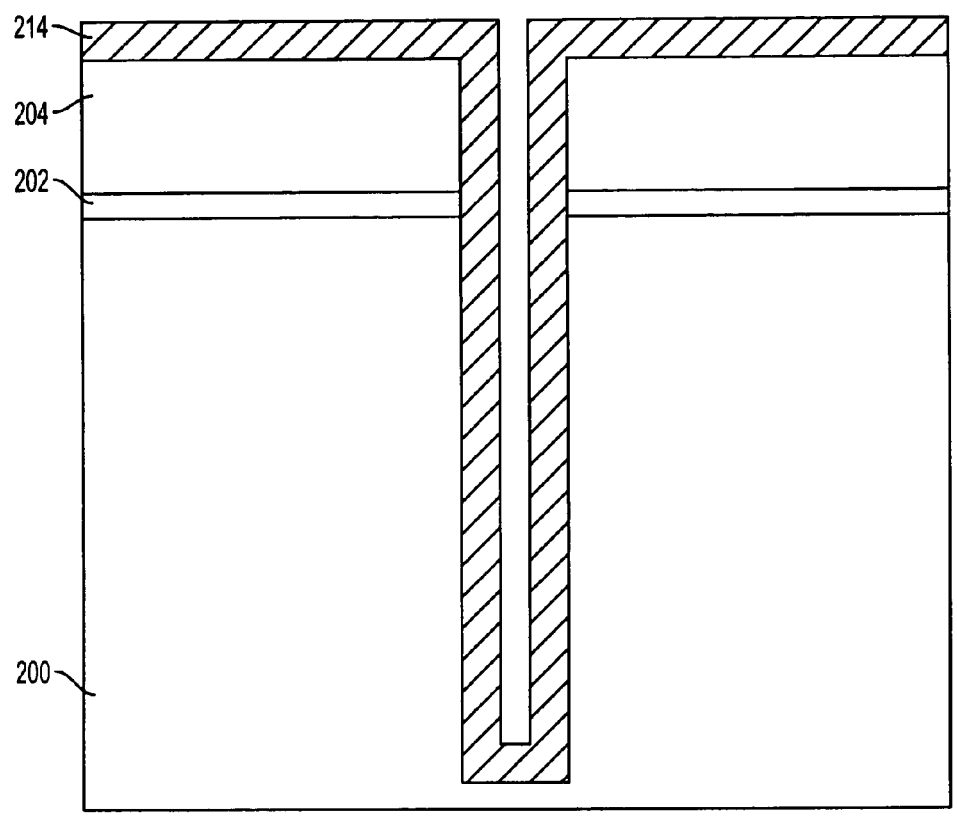
Figure 3D:
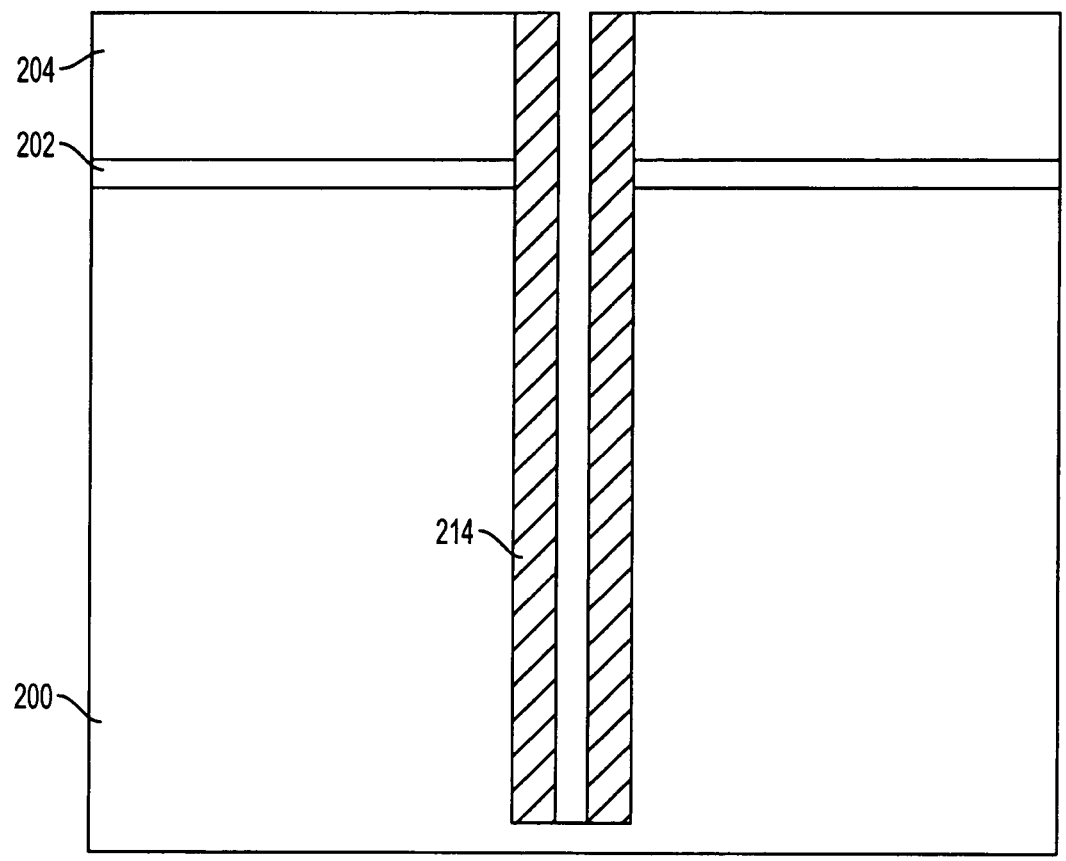
Figure 3E:
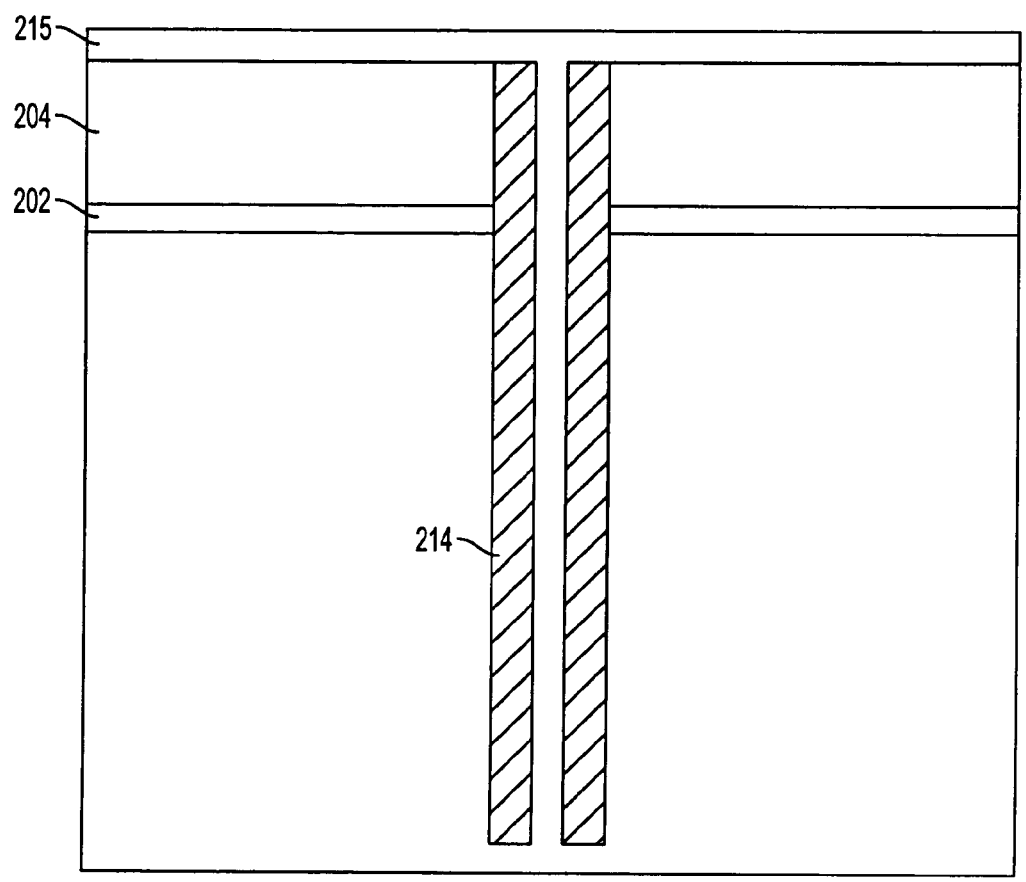
Figure 3F:
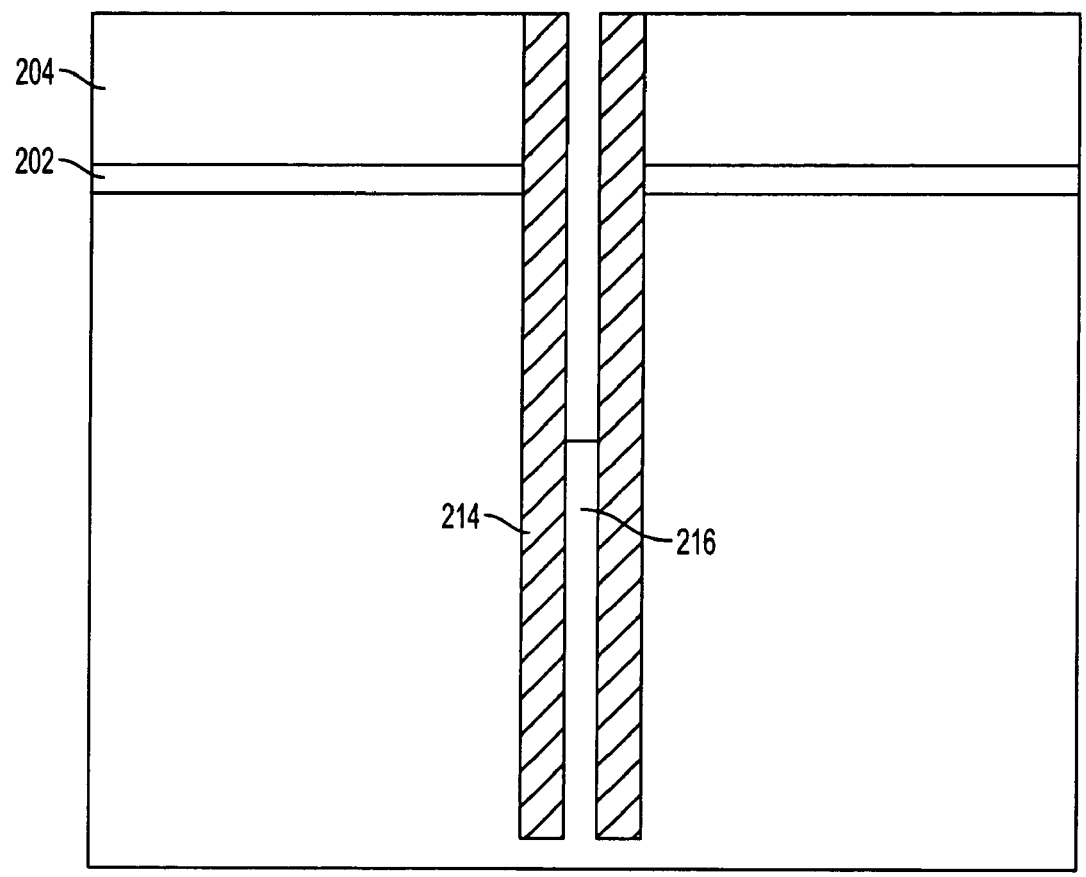

In FIG. 3F, the polycrystalline silicon layer 215 is removed from the top of pad layer 207 and recessed a predetermined distance in the deep trench 212. A recess etch (having parameters such as a pressure He BSC ⅔ Torr, pressure 10 mTorr, bias power 90 W, RF-Power 600 W, flow Cl2 60 sccm, flow SF6 30 sccm, and a time of 17 sec) or reactive ion etch are used to recess the poly silicon layer 215. This is a timed etch and the recess stops at about 1200 angstroms forming a narrower trench.

Figure 3G:
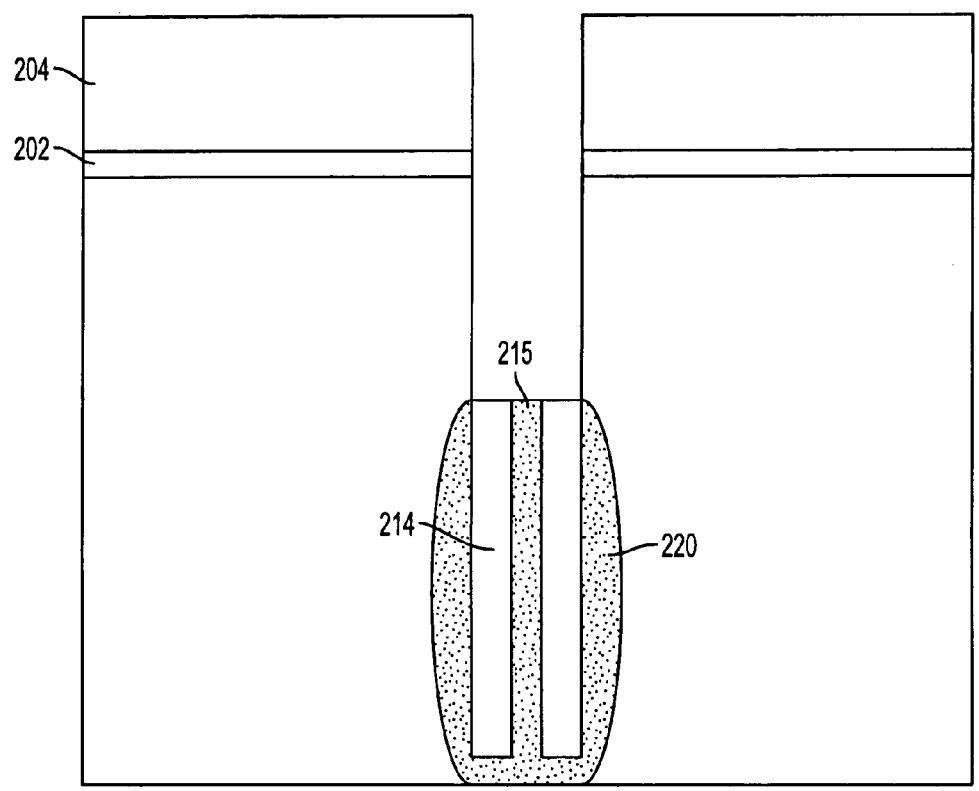

In FIG. 3G, the remaining portion of the first insulating layer 214 formed on the sidewalls of the deep trench 212 by arsenic doped LPCVD is stripped back to the same level of the polycrystalline silicon layer 215, which extends from the bottom of the deep trench 212 leaving a doped insulating layer 220. The stripping of the doped insulating layer may be performed by HF based wet etching. The arsenic ions from the doped insulating layer 220 are then driven into the substrate 200 to form a junction with a depth of about 800 angstroms as a bottom electrode 230 illustrated in FIG. 3I. Accordingly, the arsenic plate is formed at the bottom of the trench.

Figure 3H:
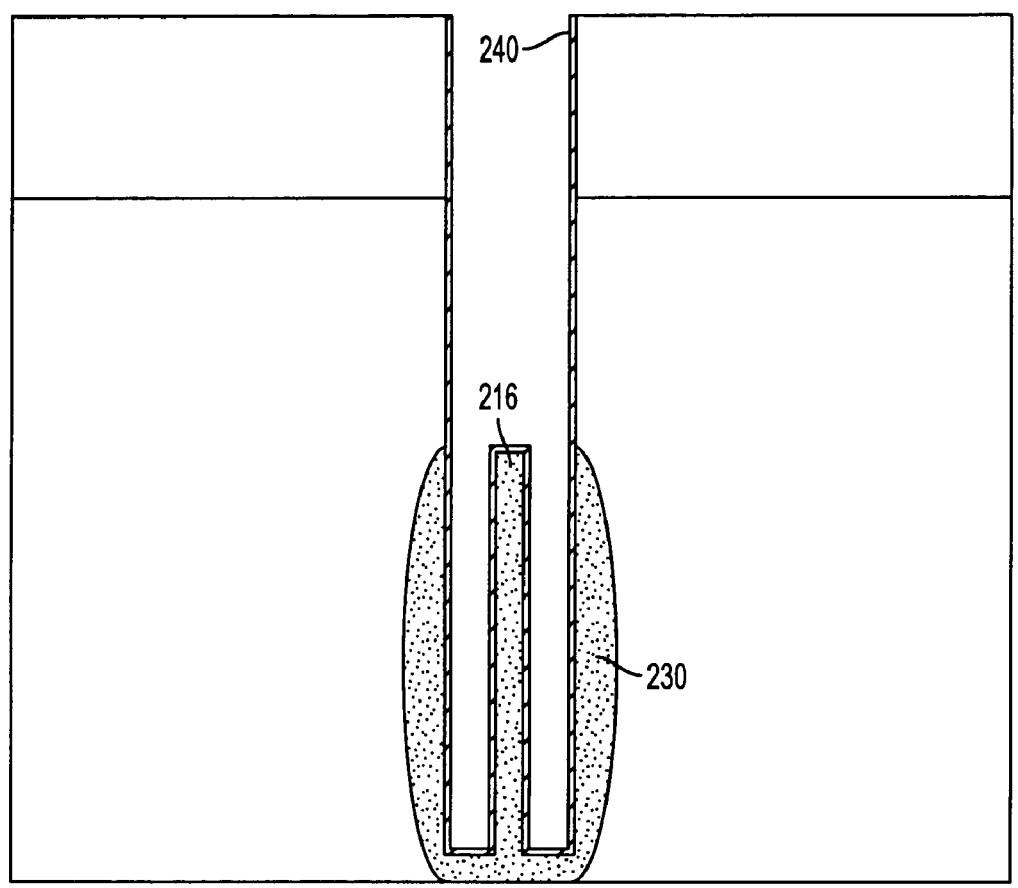

In FIG. 3H, the doped insulating layer 220 is removed from the sidewall of the deep trench 212, using, for example, an HF based wet etch (isotropic) thus forming a protrusion or a finger like structure 216 extending from the bottom of the trench. The finger may have a height of about 1200 angstroms. A dielectric layer 240, such as a node nitride, is formed on the sidewalls of the deep trench 212 and on the surface of the bottom electrode 230. The node nitride is formed for example by an LPCVD and has a thickness between 10 to 100 angstroms.

Figure 3I:
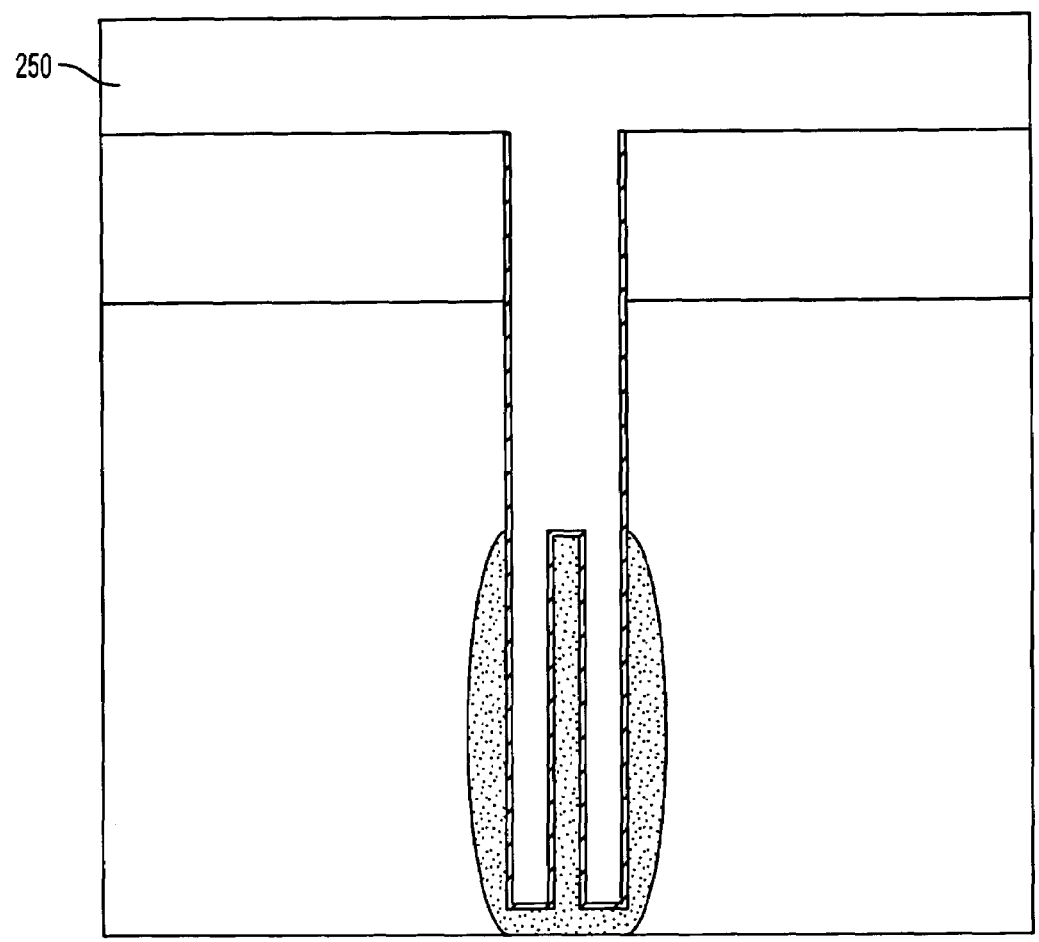

In FIG. 3I, a conductive layer 250 such as polycrystalline silicon doped with arsenic ions or phosphorous ions is formed on the deep trench 212 and on the pad layer 207 by LPCVD silane based deposition, for example, and has a thickness of about 300 nanometers.

Figure 3J:
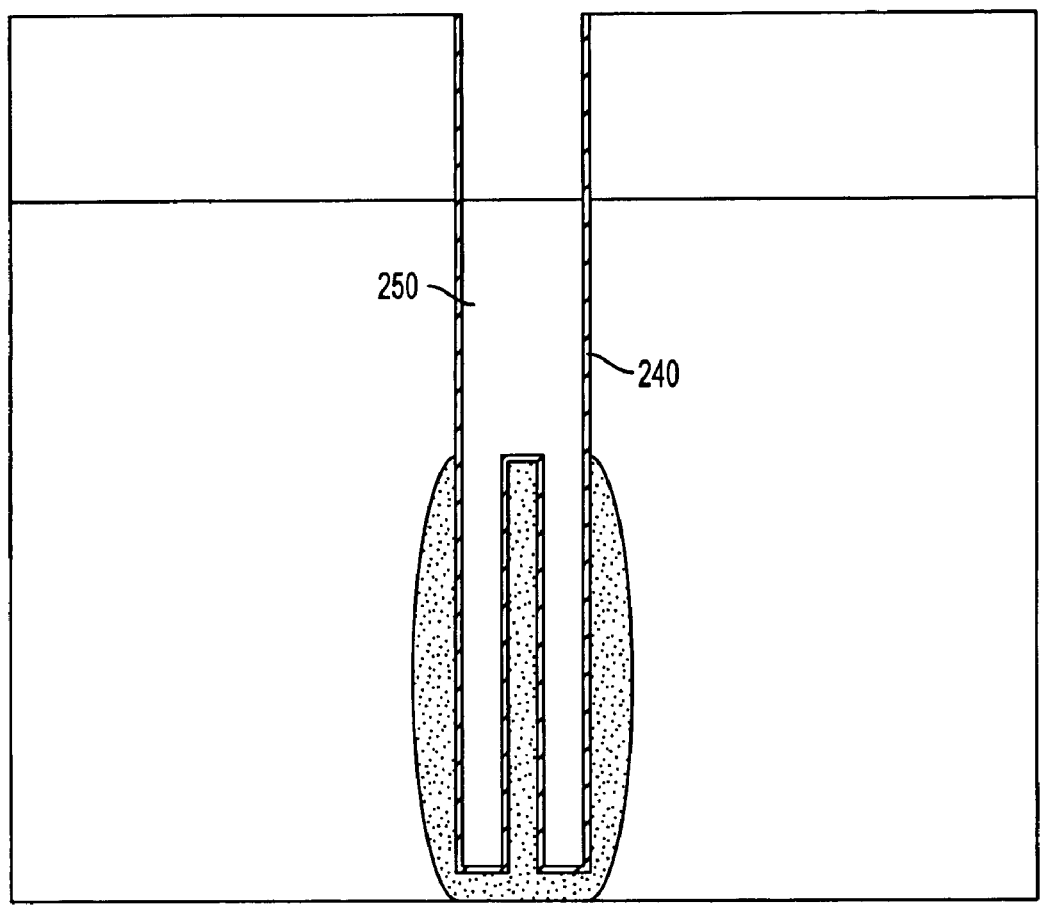

In FIG. 3J, a portion of the conductive layer 250 formed on the deep trench 212 is removed by recess etching (having parameters such as pressure He BSC ⅔ Torr; pressure 10 mTorr; bias power 90 W; RF-Power 600 W; flow Cl2 60 sccm; flow SF6 30 sccm; time 17 sec) or anisotropic reactive ion etch, and the remaining portion of the conductive layer 250 surrounded by the dielectric layer 240 forms a top electrode 250. Accordingly, the manufacture of the trench capacitor of a memory cell is completed.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A method of fabricating a capacitor in a semiconductor substrate, comprising:
    forming a trench having side walls and a bottom surface in the semiconductor substrate;
    forming a first layer within the trench;
    removing the first layer from the bottom surface of the trench;
    forming a first conductive layer on the trench;
    recessing the first conductive layer within the trench;
    removing the first layer from the side walls of the trench, forming a structure protruding from the bottom surface of the trench;
    depositing a doped insulating layer on the trench;
    driving out charged elements from the doped insulating layer into the semiconductor substrate, forming a doped substrate region;
    removing the doped insulating layer from the trench forming a first electrode;
    forming a dielectric layer within the trench;
    forming a second conductive layer on the trench, and
    recessing the second conductive layer within the trench forming a second electrode.

2. The method according to claim 1, wherein the semiconductor substrate is silicon or germanium.

3. The method according to claim 1, wherein before forming the trench in the semiconductor substrate, a first masking layer is formed on the semiconductor substrate.

4. The method according to claim 1, wherein the first layer is an oxide layer.

5. The method according to claim 1, wherein the first layer is removed from an upper surface of the semiconductor substrate, and from the bottom surface of the trench by a spacer etch process.

6. The method according to claim 1, wherein the first conductive layer is a polycrystalline silicon layer.

7. The method according to claim 1, wherein the doped insulating layer is arsenic-silicate glass (ASG).

8. The method according to claim 1, wherein the dielectric layer is a node nitride.

9. The method according to claim 1, wherein the second conductive layer is polycrystalline silicon doped with arsenic ions or phosphorous ions.

10. A method of fabricating a trench capacitor in a semiconductor substrate, comprising:
    forming a trench having sidewalls and a bottom surface in the semiconductor substrate;
    forming a first layer on the side walls and the bottom surface of the trench;
    removing the first layer from the bottom surface of the trench;
    forming a first conductive layer on the semiconductor substrate and on the trench;
    recessing the first conductive layer and the first layer a predetermined distance in the trench;
    driving out charged elements from the first layer into the semiconductor substrate, to form a doped substrate region;
    removing the first layer from the sidewalls of the trench forming a protrusion within the trench and a first electrode;
    forming a dielectric layer on the sidewalls of the trench and on the protrusion;
    forming a second conductive layer on the trench, and
    removing a portion of the second conductive layer from the trench forming a second electrode.

11. The method according to claim 10, wherein the semiconductor substrate is silicon or germanium.

12. The method according to claim 10, wherein before forming the trench in the semiconductor substrate, a first masking layer is formed on the semiconductor substrate.

13. The method according to claim 10, wherein the first layer is an oxide layer.

14. The method according to claim 10, wherein the first layer is removed from the upper surface of the semiconductor substrate, and from the bottom surface of the trench by a spacer etch process.

15. The method according to claim 10, wherein the first conductive layer is a polycrystalline silicon layer.

16. The method according to claim 10, wherein the doped insulating layer is arsenic-silicate glass (ASG).

17. The method according to claim 10, wherein the dielectric layer is a node nitride.

18. The method according to claim 10, wherein the second conductive layer is polycrystalline silicon doped with arsenic ions or phosphorous ions.

19. A method of fabricating a capacitor in a semiconductor substrate having a trench with a bottom and side walls, comprising:
    forming a first layer on the walls of the trench;
    forming a first conductive layer in the trench;
    recessing the first conductive layer within the trench;
    removing the first layer to form a conductive structure within the trench;
    implanting impurities into the semiconductor substrate, in the vicinity of the conductive structure;
    forming a dielectric layer on the walls of the trench and on the conductive structure; and
    forming a second conductive layer on the dielectric layer.

20. A method of fabricating a capacitor in a semiconductor substrate having a trench with a bottom and side walls, comprising:
    forming a doped insulator on the walls of the trench;
    forming a first conductive layer in the trench;
    recessing the first conductive layer and the doped insulator a predetermined distance in the trench such that a remainder portion of first conductive layer is sandwiched by the doped insulator;
    driving out charge elements from the doped insulator into the semiconductor substrate;
    removing the doped insulator from around the remainder portion of the first conductive layer;
    forming a dielectric layer on the walls of the trench in the remainder portion of the first conductive layer; and
    forming a second conductive layer within the trench, on the dielectric layer.

* * * * *